United States Patent
Nakamura

(10) Patent No.: US 7,874,848 B2
(45) Date of Patent: Jan. 25, 2011

(54) CONNECTOR FOR INSERTING WIRING BOARD, AND METHOD FOR MANUFACTURING THE SAME

(75) Inventor: Hidehiro Nakamura, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/573,979

(22) Filed: Oct. 6, 2009

(65) Prior Publication Data

US 2010/0136803 A1 Jun. 3, 2010

(30) Foreign Application Priority Data

Oct. 6, 2008 (JP) .......................... P2008-259420

(51) Int. Cl.
*H01R 12/00* (2006.01)

(52) U.S. Cl. .......................................... 439/67; 439/77

(58) Field of Classification Search .................. 439/65, 439/67, 77; 361/749
See application file for complete search history.

(56) References Cited

U.S. PATENT DOCUMENTS

| | | | |
|---|---|---|---|
| 6,707,689 B2* | 3/2004 | Momota et al. | 361/833 |
| 7,148,428 B2* | 12/2006 | Meier et al. | 174/260 |
| 7,563,645 B2* | 7/2009 | Jaeck | 438/117 |
| 7,639,513 B2* | 12/2009 | Otsuki | 361/818 |
| 2005/0168957 A1* | 8/2005 | Kawauchi et al. | 361/749 |
| 2008/0266819 A1* | 10/2008 | Su et al. | 361/752 |
| 2009/0129041 A1* | 5/2009 | Cho et al. | 361/803 |
| 2009/0201652 A1* | 8/2009 | Chew et al. | 361/749 |
| 2010/0118499 A1* | 5/2010 | Lin et al. | 361/749 |
| 2010/0165581 A1* | 7/2010 | Ziglioli et al. | 361/730 |

FOREIGN PATENT DOCUMENTS

JP 2004-335547 11/2004

* cited by examiner

*Primary Examiner*—T C Patel
*Assistant Examiner*—Phuong Nguyen
(74) *Attorney, Agent, or Firm*—Antonelli, Terry, Stout & Kraus, LLP.

(57) ABSTRACT

A wiring board insertion connector having only a small restriction on the structure of a wiring board to be inserted to the connector and high connection reliability includes a first substrate; a second substrate; a spacer layer that is located between the first substrate and the second substrate; and openings for accommodating a wiring board at predetermined positions in the spacer layer. The first substrate has a wiring layer, a deformable layer, a rigid layer, and a resin layer formed in this order from the side of the spacer layer. The rigid layer has window portions formed at the regions corresponding to the openings, when seen from a thickness direction of the connector. The wiring layer extends at least to the regions corresponding to the window portions when seen from the thickness direction of the connector, the wiring layer protruding toward opening regions at the window portions.

11 Claims, 5 Drawing Sheets

CONNECTOR FOR INSERTING WIRING BOARD, AND METHOD FOR MANUFACTURING THE SAME

TECHNICAL FIELD

The present invention relates to a connector to which a wiring board, a card, or a chip to be electrically connected to a system is inserted in a card-edge manner, and to a method for manufacturing the connector.

BACKGROUND ART

Development of small-sized, high-performance information communication devices such as mobile telephones, electronic dictionaries, and digital video cameras is becoming more and more rapid, not only because semiconductor devices have higher integration and higher speed than ever, but also because those semiconductor devices consume less electric power. In those mobile devices, various kinds of memory cards containing memory devices for storing information are used in an inserted state in a card-edge manner. Not only concavity-type connectors to which those cards are to be inserted and connected, but also concavity-type connectors of the USB (Universal Serial Bus) standard often seen in personal computers are used to mutually control peripheral devices such as printers, mouses, and measuring devices. In recent years, attention is drawn to concavity-type connectors to connect components having developing LEDs mounted thereon, because of the international standardization. Also, to connect multilayer printed boards to each other, there have been structures having concave connecting portions in the multilayer substrates (see Patent Document 1, for example).

Prior Technical Document

Patent Document

Patent Document 1: Japanese Patent Application Laid-open No. 2004-335547

DISCLOSURE OF THE INVENTION

Problems to be Solved by the Invention

When a wiring board such as a printed wiring board is inserted to or pulled out from a connector, there is the need to pay more attention to a reduction of stress than to insertion and pullout of a connector to and from a personal computer.

In the wiring board disclosed in JP-A No. 2004-335547, protrusions are formed at exposed conductive portions of the wiring board to be inserted, and through hole terminals to be engaged with the protrusions are formed at the insertion openings of a multilayer printed wiring board. In this manner, the wiring board and the multilayer printed wiring board can be connected to each other.

When insertion and pullout are repeated, however, the conductors are required to have strength and resistance to bending. Therefore, it is difficult to improve the durability against repetitive insertion and pullout. Also, since the protrusions are to be engaged with the through holes, it is necessary to perform a special treatment for the wiring board to be inserted. Such a wiring board lacks versatility.

Therefore, there has been a demand for a wiring board connector that has only a small restriction on the structure of a wiring board to be inserted, has a simple structure with high productivity, and has high connection reliability such as durability against repetitive insertion and pullout.

The present invention has been made in view of the above problems, and aims to provide a wiring board insertion connector that has only a small restriction on the structure of a wiring board to be inserted to the connector, has high connection reliability such as high durability against repetitive insertion and pullout, and has a relatively simple structure. The present invention also aims to provide a method for manufacturing a wiring board insertion connector, by which the connector having the above features can be readily produced with high productivity.

Means for Solving the Problems

The present invention relates to the followings:

(1) A connector for inserting a wiring board, including:
a first substrate;
a second substrate; and
a spacer layer that is located between the first substrate and the second substrate, with openings for accommodating a wiring board being formed at predetermined positions in the spacer layer,
the first substrate including a wiring layer, a deformable layer, and a rigid layer in this order from the side of the spacer layer,
the rigid layer having window portions at the regions corresponding to the openings, when seen from the thickness direction of the connector,
the wiring layer extending at least to the regions corresponding to the window portions when seen from the thickness direction of the connector, the wiring layer protruding toward opening regions at the window portions.

(2) The connector for inserting a wiring board according to above-mentioned (1), wherein the second substrate has the same structure as the first substrate.

(3) The connector for inserting a wiring board according to above-mentioned (1) or (2), further comprising
a resin layer that is formed on the rigid layer,
wherein the deformable layer and the resin layer have light transmissibility.

(4) A method for manufacturing a connector for inserting a wiring board, the method including:
preparing a spacer board that has notches from which portions are to be removed to form openings in a later stage;
preparing adhesive layers that adhere to the surfaces of the spacer board, except for the portions to be removed to form the openings;
preparing a first substrate that includes a wiring layer, a deformable layer, a rigid layer, and a resin layer in this order, the rigid layer having window portions at the regions corresponding to the openings when seen from the thickness direction of the connector;
preparing a second substrate;
stacking the first substrate, the second substrate, and the spacer board by placing the first substrate on one surface of the spacer board via the corresponding adhesive layer and placing the second substrate on the other surface of the spacer board via the corresponding adhesive layer, to allow a visual check on the end portions of the notches formed in the spacer substrate from the thickness direction of the spacer board;
fixing the spacer board, the first substrate, and the second substrate by performing heating and pressurizing under reduced pressure; and
forming the openings by removing the portions to be removed to form the openings with the use of the notches of the spacer board.

(5) The method for manufacturing a connector for inserting a wiring board according to above-mentioned (4), wherein the second substrate has the same structure as the first substrate.

(6) The method for manufacturing a connector for inserting a wiring board according to above-mentioned (4) or (5), wherein dummy wires are formed at the portions to be removed to form the openings.

(7) The method for manufacturing a connector for inserting a wiring board according to above-mentioned (4) or (5), wherein the adhesive layers are formed with adhesive films or by applying an adhesive agent onto the spacer board.

Effect of the Invention

The present invention can provide a wiring board insertion connector that has only a small restriction on the structure of a wiring board to be inserted to the connector, has high connection reliability such as high durability against repetitive insertion and pullout, and has a relatively simple structure. The present invention can also provide a method for manufacturing a wiring board insertion connector, by which the connector having the above features can be readily produced with high productivity.

BEST MODE FOR CARRYING OUT THE INVENTION

Figure 1A:
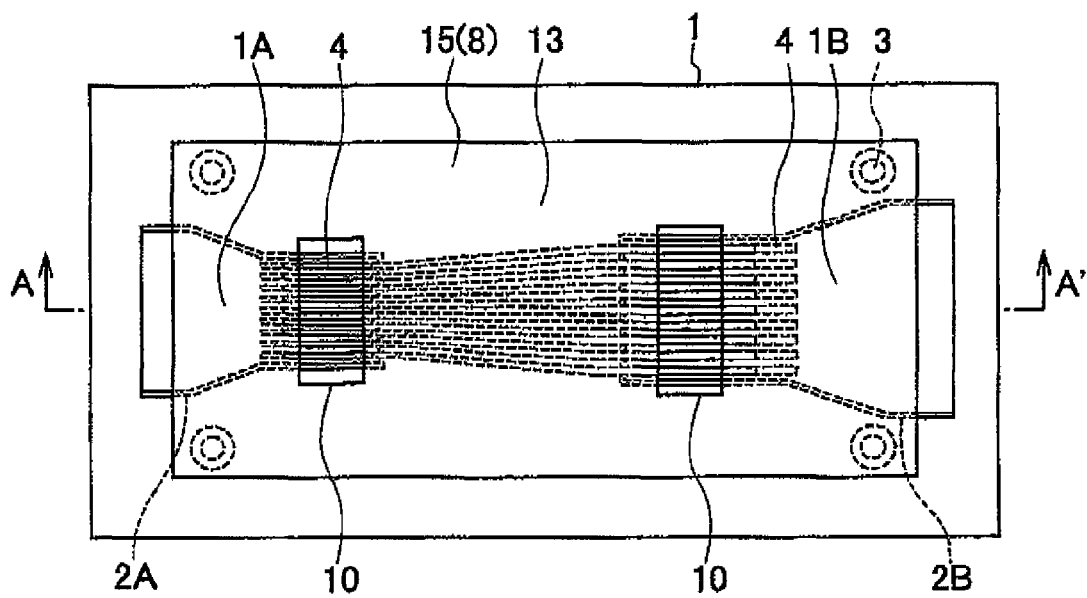
FIG. 1A is a top view illustrating a method for manufacturing a wiring board insertion connector of the present invention.

A connector for inserting a wiring board according to the present invention includes: a first substrate; a second substrate; and a spacer layer that is located between the first substrate and the second substrate, with openings for inserting a wiring board being formed at predetermined positions in the spacer layer. The first substrate includes a wiring layer 7, a deformable layer 8, and a rigid layer 15 in this order from the side of the spacer layer. The rigid layer has window portions 10 at the regions corresponding to the openings, when seen from the thickness direction of the connector. The wiring layer extends at least to the regions corresponding to the window portions when seen from the thickness direction of the connector. The wiring layer protrudes toward the opening regions at the window portions.

A method for manufacturing a connector for inserting a wiring board according to the present invention, the method including:

preparing a spacer board that has notches from which portions are to be removed to form openings in a later stage;

preparing adhesive layers that adhere to the surfaces of the spacer board, except for the portions to be removed to form the openings;

preparing a first substrate that includes a wiring layer 7, a deformable layer 8, a rigid layer 15, and a resin layer 13 in this order, the rigid layer having window portions 10 at the regions corresponding to the openings when seen from the thickness direction of the connector;

preparing a second substrate;

stacking the first substrate, the second substrate, and the spacer board by placing the first substrate on one surface of the spacer board via the corresponding adhesive layer and placing the second substrate on the other surface of the spacer board via the corresponding adhesive layer, to allow a visual check on the end portions of the notches formed in the spacer substrate from the thickness direction of the spacer board;

fixing the spacer board, the first substrate, and the second substrate by performing heating and pressurizing under reduced pressure; and forming the openings by removing the portions to be removed to form the openings with the use of the notches of the spacer board.

The following is a description of the connector for inserting a wiring board and the method for manufacturing the connector.

Figure 1B:
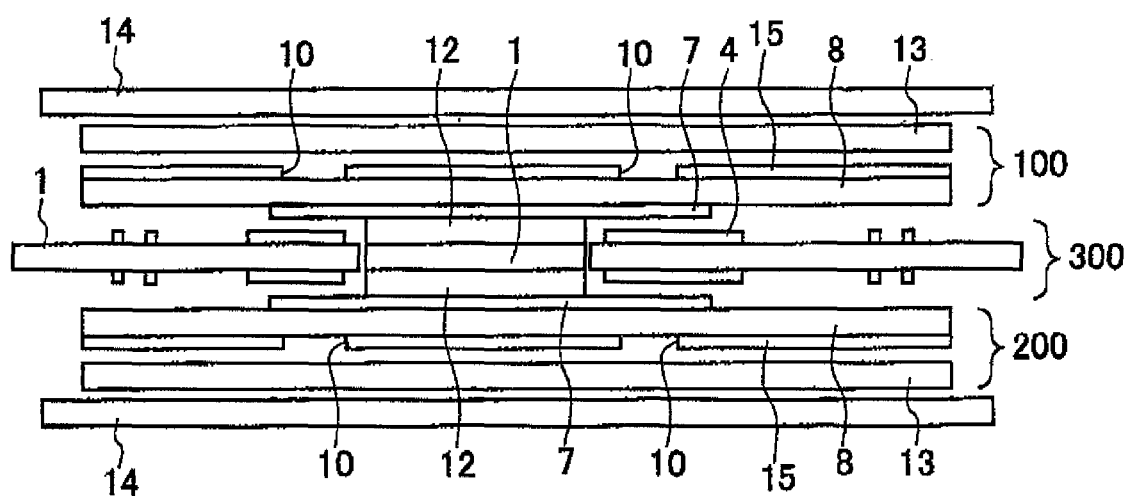
FIG. 1B is a cross-sectional view, taken along the line A-A' of FIG. 1A, for explaining the method for manufacturing the wiring board insertion connector of the present invention.

<First Substrate> (See FIGS. 1A and 1B)

The first substrate according to the present invention includes a wiring layer 7, a deformable layer 8, a rigid layer 15, and a resin layer 13 if necessary, in this order from the side of the spacer layer 300. The rigid layer 15 has window portions 10 in the regions corresponding to the openings, when seen from the thickness direction of the connector.

[Wiring]

The wiring layer is a metal layer such as a copper layer that is preferred because of its conductivity and processability, though any conductive material may be used as the wiring layer.

[Deformable Layer]

The deformable layer is made of a base material such as thermosetting resin, light-curing resin, or thermoplastic resin.

The thermosetting resin may be formed by heating and partially hardening or completely hardening a mixture of one or more materials selected from a group including epoxy resin, bismaleimide-triazine resin, polyimide resin, cyanoacrylate resin, phenol resin, unsaturated polyester resin, melamine resin, urea formaldehyde resin, polyisocyanate resin, furan resin, resorcinol resin, xylene resin, benzoguanamine resin, diarylphthalate resin, silicone-modified epoxy resin, silicone-modified polyamideimide resin, and benzocyclobutene resin, and its hardening agent or hardening accelerator, if necessary.

The light curing resin may be a material formed by exposing or heating and partially hardening or completely hardening a mixture of one or more materials selected from a group including unsaturated polyester resin, polyesteracrylate resin, urethaneacrylate resin, silicone acrylate resin, and epoxy acrylate resin, and its photoinitiator, hardening agent, or hardening accelerator, if necessary.

The thermoplastic resin may be a material formed by heating and partially hardening or completely hardening a mixture of one or more materials selected from a group including polycarbonate resin, polysulfone resin, polyetherimide resin, thermoplastic polyimide resin, polyethylene tetrafluoride resin, polypropylene hexafluoride resin, polyether ether ketone resin, vinyl chloride resin, polyethylene resin, polyamideimide resin, polyphenylene sulfide resin, polyoxy benzoate resin, and liquid crystal polymers, and its hardening agent or hardening accelerator, if necessary. Those insulating resins may be insulating resin compositions formed with mixtures of different kinds of resins, and each of those insulating resin compositions may include inorganic filler such as silica or a metal oxide. The inorganic filler may be conductive particles of a metal such as nickel, gold or silver, or resin particles plated with such a metal.

As a thermoplastic liquid crystal polymer, it is preferable to use BIAC-C, which is manufactured by Japan Gore-Tex, Inc.

The thickness of the deformable layer is preferably in the range of 50 µm to 200 µm, more preferably, in the range of 100 µm to 150 µm.

[Rigid Layer]

As the rigid layer, it is preferable to use a metal layer such as a copper layer that can be easily processed by etching, with easy formation of the window portions being taken into consideration. However, there is not a particular limit to the material of the rigid layer, as long as it is not easily deformed when heating and pressurizing are performed (by a vacuum laminating machine, for example) under reduced pressure.

The thickness of the rigid layer is preferably in the range of 10 µm to 60 µm, more preferably, in the range of 18 µm to 50 µm.

The window portions 10 formed in the rigid layer 15 are designed so that the pressure generated by pressing the resin layer 14 above the rigid layer 15 toward the spacer board 1 as will be described later can be transmitted to the deformable layer 8. The deformable layer 8 pressed through the window portions 10 protrudes toward the spacer board 1, and the portions of the wiring layer 7 located at the protruding portions also protrude. Since the protruding portions of the wiring layer 7 exist inside the window portions 10, the positions and sizes of the window portions 10 are determined by estimating the positions of the protruding portions to be formed in the wiring layer 7.

[Resin Layer]

The material of the resin layer may be polyethylene or polypropylene, or a combination of those materials, for example. Examples of those materials in the form of sheets that are commercially available include the polyethylene sheet (100 µm in thickness) manufactured by Sekisui Chemical Co., Ltd. and the polypropylene sheet (60 µm in thickness) manufactured by Toray Industries, Inc., or a combination of those sheets.

The resin layer is preferably thicker than the deformable layer, so as to adjust the size of each protrusion. The thickness of the resin layer is preferably one to three times greater than the thickness of the deformable layer.

For example, where the deformable layer 8 is BIAC-C, and the substrate thickness is 125 µm, the thickness of the resin layer is preferably in the range of 125 µm to 375 µm, and more preferably, in the range of 160 µm to 320 µm.

The resin layer is a layer that is formed during the manufacture, and may be removed after the manufacture.

<Second Substrate> (See FIGS. 1A and 1B)

Like the first substrate, the second substrate preferably includes a wiring layer 7, a deformable layer 8, a rigid layer 15, and a resin layer 13 if necessary, in this order. However, the structure of the second substrate is not limited to that.

Figure 2:
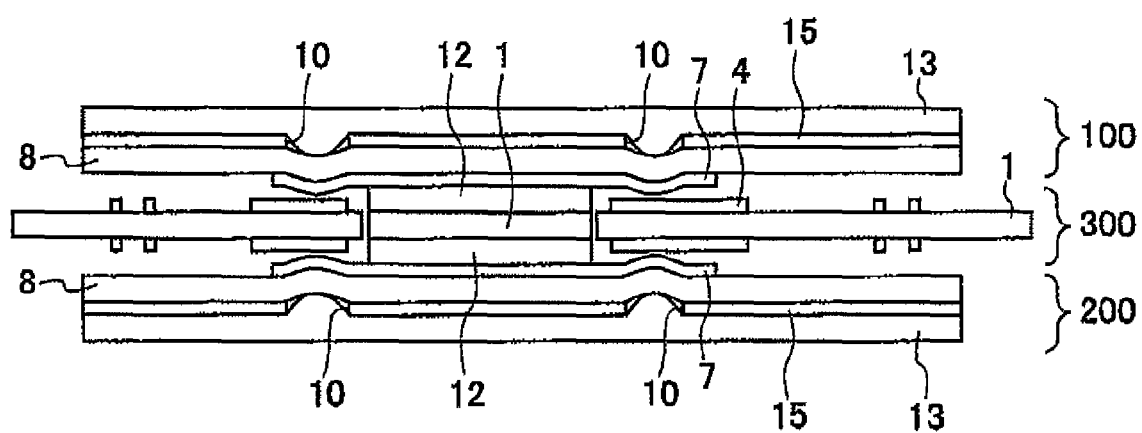
FIG. 2 is a cross-sectional view showing a state observed after the wiring layer is deformed, with the deformable layer being already deformed by pressure toward the window portions of the resin layer.

<Spacer Layer> (See FIGS. 1A, 1B, and 2)

The spacer layer 300 according to the present invention is located between the first substrate 100 and the second substrate 200, and includes the spacer board 1 and adhesive layers 12 located on both faces of the spacer board 1. The spacer layer 300 has openings at predetermined positions for inserting a wiring board.

A plate-like wiring board such as a flexible wiring board can be engaged with and connected to the wiring board insertion openings of the spacer layer.

The thickness of the spacer layer is preferably in the range of 80 µm to 200 µm, more preferably, in the range of 100 µm to 150 µm.

As shown in FIG. 1A, notches 2A and 2B are formed in the spacer board 1, so that opening portions can be removed when the openings are formed later.

Figure 3A:
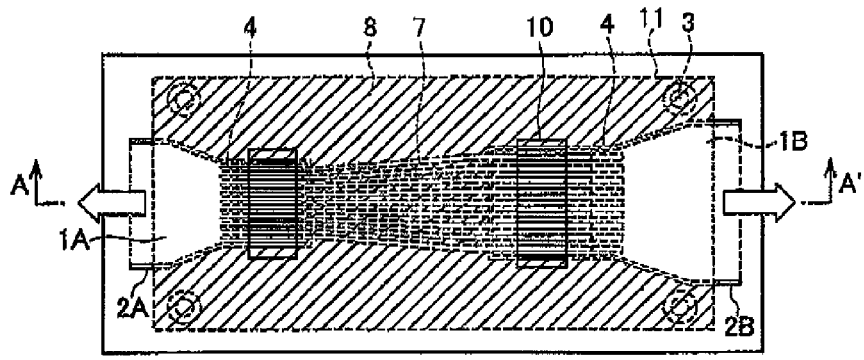
FIG. 3A is a top view for explaining the method for manufacturing the wiring board insertion connector of the present invention, showing a state observed before the spacer board is cut out along the cutting line.
Figure 3B:
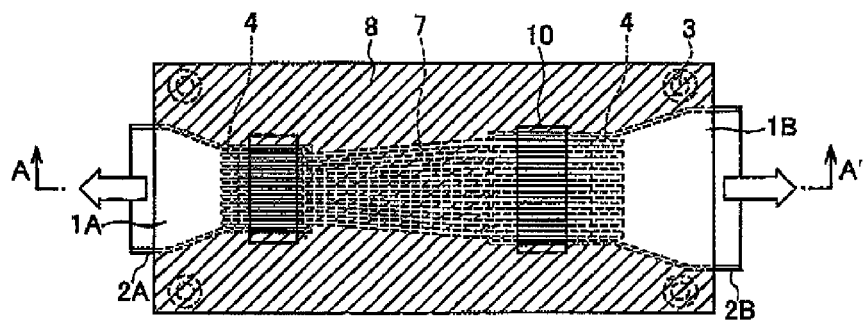
FIG. 3B is a top view for explaining the method for manufacturing the wiring board insertion connector of the present invention, showing a state observed after the spacer board is cut out and before the cut pieces are pulled out.
Figure 3C:
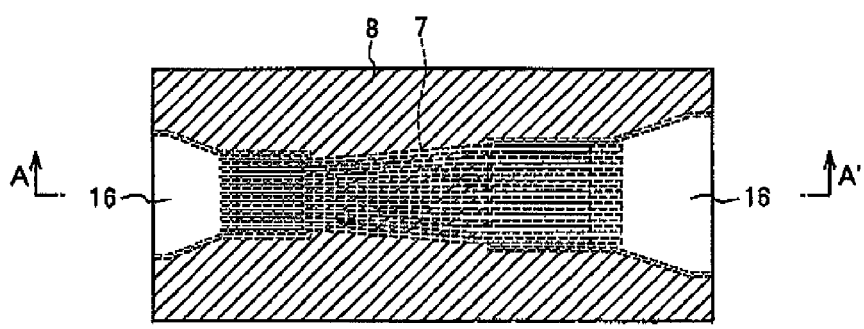
FIG. 3C is a top view for explaining the method for manufacturing the wiring board insertion connector of the present invention, showing a state observed after the cue pieces are pulled out, with the cut pieces being indicated by the portions (1A, 1B) surrounded by notches designed to form openings in the spacer board.

The adhesive layers are formed on the regions except for the portions to be removed when the openings are formed in the spacer board. More specifically, the regions on which the adhesive layers 12 are formed are represented by the hatched regions in FIGS. 3A through 3C. The hatched regions in the FIGS. 3A through 3C are the minimum regions on which the adhesive layers are formed, and the adhesive layers may be formed outside the hatched region. However, since cut pieces 1A and 1B need to be pulled out in a later procedure, the adhesive layers are not formed on the cut pieces 1A and 1B located inside the notches 2A and 2B of the spacer board. The thickness of each adhesive layer is preferably in the range of 5 µm to 50 µm, more preferably, in the range of 10 µm to 30 µm.

Adhesive films may be used as the adhesive layers, and KS7003 (25 µm in thickness) manufactured by Hitachi Chemical Co., Ltd. may be used, for example. Alternatively, an adhesive agent may be applied onto the surfaces of the spacer boards, to form the adhesive layers. In such a case, a varnish prepared with the use of the above mentioned KS7003 may be used as the adhesive agent.

<Stack Structure of First Substrate, Spacer Board, and Second Substrate>

The first substrate, the spacer board, and the second substrate are stacked in the following manner. The first substrate is placed on one of the surfaces of the spacer board via an adhesive layer, and the second substrate is placed on the other one of the surfaces of the spacer board via an adhesive layer. With this arrangement, the end portions of the notches formed in the spacer board can be seen from the thickness direction of the spacer board.

The spacer board 1, the adhesive layers 12, the first substrate 100, and the second substrate 200 are preferably positioned with the use of a guide pin 3 (φ2.0 mm).

<Formation of Wiring Protrusions toward Fixed-Opening Regions> (See FIGS. 1A, 1B, 2, and 3C)

After the first substrate, the spacer board, and the second substrate are stacked, those layers are heated and pressurized under reduced pressure. In this manner, the first substrate, the spacer board, and the second substrate are fixed. More specifically, as shown in the cross-sectional view in FIG. 1B, the stack structure formed by placed the first substrate 100 and the second substrate 200 on both surfaces of the spacer board 1 via the adhesive layers 12 is sandwiched by a pair of SUS boards, and heating and pressurizing are performed inward. By the heating and pressurizing, the resin layers 13 are liquefied, and flow into the window portions 10. As a result, the resin layers 13 press the deformable layers 8. The pressed deformable layers 8 protrude toward the spacer board 1, and the portions of the wiring layers 7 located at the protruding portions also protrude (see FIG. 2). The pressing conditions here include a heating temperature in the range of 150° C. to 330° C., and a pressure of 1 MPa to 4 MPa. The pressing may be performed with the use of a vacuum laminating machine or a vacuum presser. Here, the degree of vacuum is preferably equal to or lower than $1.33 \times 10^2$ Pa (1.0 ton), and more preferably, equal to or lower than 26.7 Pa (0.2 ton).

As shown in FIGS. 1A, 1B, and 2, dummy wires 4 corresponding to the connection terminal portions formed on a wiring board to be inserted and pulled out are formed on both surfaces of each of the cut pieces 1A and 1B of the spacer board. With the compatibility with actual usage being taken into consideration, those dummy wires are preferably made of the same material as the material of the connection terminal portions of plate-like connectors.

Figure 3D:
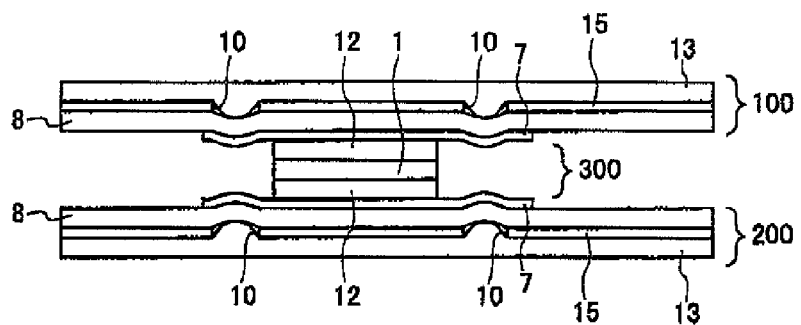
FIG. 3D is a cross-sectional view of the structure, taken along the line A-A' of FIG. 3C.

The cut pieces 1A and 1B are removed to form openings, and FIG. 3D shows a structure after removed those cut pieces.

<Formation of Openings> (See FIGS. 3A through 3D)

As shown in FIGS. 1A, 1B, and 2, the spacer board is slightly larger than the first substrate and the second substrate. Accordingly, after the predetermined outline processing is performed to remove substantially outer peripheral portions of the first substrate or the second substrate by cutting, parts of the spacer board are removed with the use of the notches, to form the openings. FIGS. 3A through 3D illustrate the procedures for forming the openings. FIG. 3A shows the state observed prior to the removal of parts of the spacer board. FIG. 3B shows the state observed prior to the pulling out of the cut pieces 1A and 1B of the spacer board. FIG. 3C shows the state observed after the cut pieces 1A and 1B of the spacer board are pulled out. FIG. 3D is a cross-sectional view of the structure, taken along the line A-A' of FIG. 3C.

Figure 4:
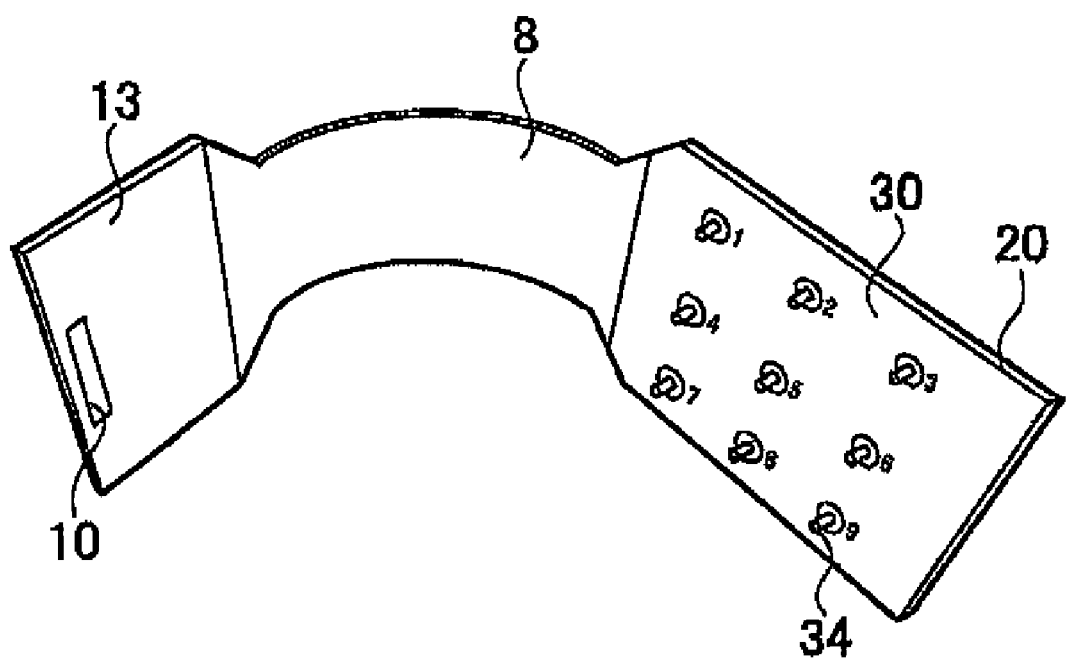
FIG. 4 is a perspective view showing a state observed when a wiring board including the wiring board insertion connector of the present invention is bent.

A wiring board having the wiring board insertion connector according to the present invention can be bent as shown in FIG. 4, depending on the selection of materials. FIG. 4 is a perspective view of a flexible printed wiring board having the wiring board insertion connector in a bent state. The flexible printed wiring board 20 shown in FIG. 4 has the wiring board insertion connector on one side (the left side in FIG. 4), and a through-hole connection regions 30 having nine pins 34 on the other side (the right side in FIG. 4). The wires provided in the wiring board insertion connector and the pins 34 of the through-hole connection region 30 are connected by the wires provided in the wiring board, and the wiring board inserted to the wiring board insertion connector can be electrically connected to another device connected via the pins 34 of the through-hole connection region 30.

Since a light transmissive resin is used for the deformable layers and the resin layers in the present invention, a visual check can be readily made to determine, through the window portions, whether the dummy wires formed at the portions to be removed to form the openings, and the wires formed in the first substrate and the second substrate are located at appropriate positions. Here, the "light transmissive resin" is a resin that has light transmissibility to such a degree as to allow a visual check on the locations of the dummy wires and the wires formed in the first substrate and the second substrate.

By changing the thickness of the spacer board, the height of each opening of the wiring board insertion connector can be arbitrarily changed, and the degree of engagement of a wiring board to be inserted to and pulled out from the wiring board insertion connector can be adjusted.

Figure 5:
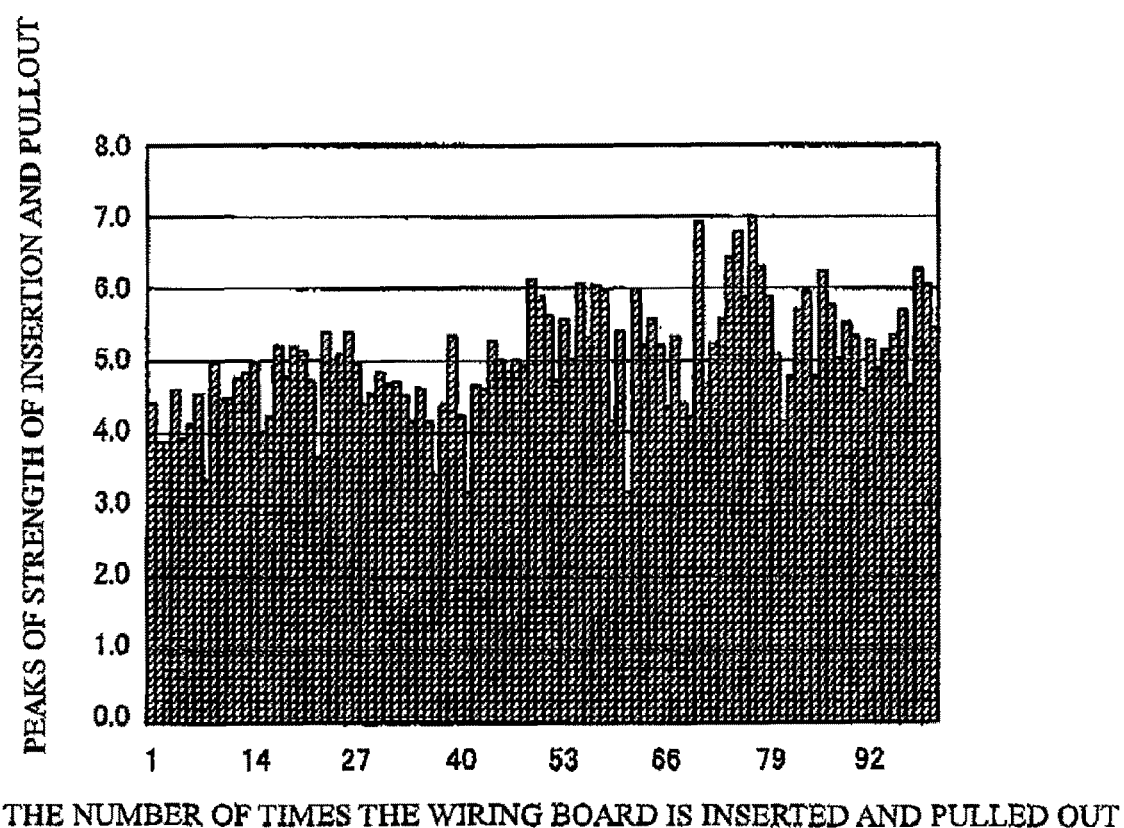
FIG. 5 is a graph showing the insertion and pullout reliability of the wiring board insertion connector of the present invention.

The insertion and pullout force of the wiring board insertion connector according to the present invention were examined, and the results are shown in FIG. 5. As can be seen from FIG. 5, a minimum force of 3.0 N was secured, and high reliability was maintained even after insertion and pulling out were repeated 100 times or more.

In a case where a thick wiring board is inserted to the wiring board insertion connector, the protruding portions of the wiring layers are deformed, and the degree of engagement becomes smaller. In such a case, the portions of the resin layers located at the window portions are pressed, so as to cause the deformable layers to protrude even further. In this manner, the portions of the wires located at the protruding portions further protrude, and the engagement force becomes larger.

DESCRIPTION OF NUMERALS 100 first substrate
200 second substrate
300 spacer layer
1 spacer board
1A, 1B pieces
2A, 2B notches
3 guide pin
4 dummy electrode terminal pattern
7 wiring layer
8 deformable layer
10 window portion
11 cut line
12 adhesive layer
13 resin layer
14 SUS board
15 rigid layer
16 opening
20 flexible printed wiring board having the wiring board insertion connector of the present invention
30 through-hole connection region
34 pin

The invention claimed is:

1. A connector for inserting a wiring board, comprising:
a first substrate;
a second substrate; and
a spacer layer that is located between the first substrate and the second substrate, with openings for accommodating a wiring board being formed at predetermined positions in the spacer layer,
the first substrate including a wiring layer, a deformable layer, and a rigid layer in this order from a side of the spacer layer,
the rigid layer having window portions at regions corresponding to the openings, when seen from a thickness direction of the connector,
the wiring layer extending at least to regions corresponding to the window portions when seen from the thickness direction of the connector, the wiring layer protruding toward opening regions at the window portions.

2. The connector for inserting a wiring board according to claim 1, further comprising
a resin layer that is formed on the rigid layer,
wherein the deformable layer and the resin layer have light transmissibility.

3. The connector for inserting a wiring board according to claim 1, wherein the second substrate has the same structure as the first substrate.

4. The connector for inserting a wiring board according to claim 3, further comprising
a resin layer that is formed on the rigid layer,
wherein the deformable layer and the resin layer have light transmissibility.

5. A method for manufacturing a connector for inserting a wiring board, comprising:
preparing a spacer board that has notches from which portions are to be removed to form openings in a later stage;
preparing adhesive layers that adhere to surfaces of the spacer board, except for the portions to be removed to form the openings;
preparing a first substrate that includes a wiring layer, a deformable layer, a rigid layer, and a resin layer in this order, the rigid layer having window portions at regions corresponding to the openings when seen from a thickness direction of the connector;
preparing a second substrate;
stacking the first substrate, the second substrate, and the spacer board by placing the first substrate on one surface of the spacer board via the corresponding adhesive layer and placing the second substrate on the other surface of the spacer board via the corresponding adhesive layer, to allow a visual check on end portions of the notches formed in the spacer substrate from a thickness direction of the spacer board;
fixing the spacer board, the first substrate, and the second substrate by performing heating and pressurizing under reduced pressure; and
forming the openings by removing the portions to be removed to form the openings with the use of the notches of the spacer board.

6. The method for manufacturing a connector for inserting a wiring board according to claim 5, wherein dummy wires are formed at the portions to be removed to form the openings.

7. The method for manufacturing a connector for inserting a wiring board according to claim 5, wherein the adhesive layers are formed with adhesive films or by applying an adhesive agent onto the spacer board.

8. The method for manufacturing a connector for inserting a wiring board according to claim 5, wherein the second substrate has the same structure as the first substrate.

9. The method for manufacturing a connector for inserting a wiring board according to claim 8, wherein the adhesive layers are formed with adhesive films or by applying an adhesive agent onto the spacer board.

10. The method for manufacturing a connector for inserting a wiring board according to claim 8, wherein dummy wires are formed at the portions to be removed to form the openings.

11. The method for manufacturing a connector for inserting a wiring board according to claim 10, wherein the adhesive layers are formed with adhesive films or by applying an adhesive agent onto the spacer board.

* * * * *